United States Patent [19]

Eichler et al.

[11] 4,390,453
[45] Jun. 28, 1983

[54] MIXTURES OF AROMATIC-ALIPHATIC KETONES AS PHOTOINITIATORS AND PHOTOPOLYMERIZABLE SYSTEMS CONTAINING THEM

[75] Inventors: Jürgen Eichler, Weiterstadt; Claus Herz, Heidelberg; Karl-Heinz Neisius, Darmstadt, all of Fed. Rep. of Germany

[73] Assignee: Merck Patent Gesellschaft mit beschränkter Haftung, Darmstadt, Fed. Rep. of Germany

[21] Appl. No.: 243,119

[22] Filed: Mar. 12, 1981

[30] Foreign Application Priority Data

Mar. 15, 1980 [DE] Fed. Rep. of Germany ....... 3010148

[51] Int. Cl.$^3$ ............................................. B01J 31/02
[52] U.S. Cl. .................................. 252/426; 204/159.18
[58] Field of Search ............................................. 252/426

[56] References Cited

U.S. PATENT DOCUMENTS

| | | | |
|---|---|---|---|
| 3,169,868 | 2/1965 | Rorden | 96/90 |
| 3,222,429 | 12/1965 | Boyd et al. | 252/426 X |
| 3,857,769 | 12/1974 | McGinniss | 252/426 X |
| 3,907,656 | 9/1975 | de Souza | 204/159.16 |
| 3,933,682 | 1/1976 | Bean | 252/426 X |
| 4,024,296 | 5/1977 | Gruber | 252/426 X |
| 4,101,558 | 7/1979 | Vacek et al. | 260/328 |
| 4,131,529 | 12/1979 | Osterloh et al. | 204/159.14 |

FOREIGN PATENT DOCUMENTS 2811755 9/1978 Fed. Rep. of Germany .
2722264 11/1978 Fed. Rep. of Germany .

OTHER PUBLICATIONS

J. Oil Col. Chem. Assoc., 1978, 61, 256–263.

*Primary Examiner*—Patrick Garvin
*Attorney, Agent, or Firm*—Millen & White

[57] ABSTRACT

Mixtures containing at least one hydroxyalkylphenone of the formula

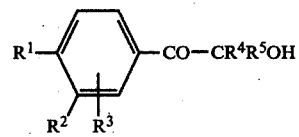

wherein $R^1$ is H, alkyl of 1–4 C atoms or chlorine, $R^2$ is H or methyl, $R^3$ is H or methyl, $R^4$ is alkyl of 1–6 C atoms and $R^5$ is alkyl of 1–6 C atoms, and at least one 2-alkylthioxanthone of the formula

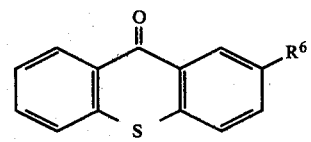

wherein $R^6$ is alkyl of 1–8 C atoms, have a considerably increased reactivity in initiating the photopolymerization of ethylenically unsaturated compounds. The polymers fully hardened using these initiator mixtures suffer only little yellowing.

5 Claims, No Drawings

MIXTURES OF AROMATIC-ALIPHATIC KETONES AS PHOTOINITIATORS AND PHOTOPOLYMERIZABLE SYSTEMS CONTAINING THEM

BACKGROUND OF THE INVENTION

The present invention relates to novel mixtures which can be used as photoinitiators and are based on aromatic-aliphatic ketones, to their use as photoinitiators, in particular for the photopolymerization of ethylenically unsaturated compounds and for the ultraviolet hardening of printing inks, and to photopolymerizable systems containing such mixtures.

Photochemically initiated polymerization reactions have gained great importance in industry, in particular when rapid hardening of thin coatings is required, such as, for example, in the hardening of lacquer coatings and resin coatings on paper, metal and plastic or in the drying of printing inks. Compared with conventional methods for the printing and coating of articles, these processes are distinguished by a saving in raw materials and energy and by reduced pollution of the environment. Since, in these reactions, none of the reactants is as a rule capable of absorbing the photochemically active radiation to an adequate extent, so-called photoinitiators must be added.

These are capable of absorbing incident visible or ultraviolet radiation and forming active starter radicals when being excited. According to the kind of reaction involved after their photoexcitation, two groups can be differentiated. After being excited, a category of compounds directly decays into active starter radicals. These, in turn, initiate the polymerization. Another category of compounds, after being excited, first interacts with a second compound to produce the active starter radicals. These, in turn, initiate the polymerization. Herein, both categories of compounds are comprised by the term "initiators." The essential criteria for the selection of such initiators are, inter alia, the type of the reaction to be carried out, the relationship of the absorption spectrum of the initiator to the spectral energy distribution of the available radiation source, the solubility of the initiator in the reaction mixture, the storage stability in the dark of the reaction system to which the initiator has been added, and the extent to which the end products are influenced by residues of initiator which have remained therein, and/or of the products formed from the initiator during the photochemical reaction. In particular, the rate of reaction strongly depends on the initiator used. For this reason, there has been no lack of attempts to provide new initiators and new initiator mixtures showing increased reactivity in initiating the photopolymerization of ethylenically unsaturated compounds or the hardening of photopolymerizable systems.

Heretofore, initiators for the photopolymerization of unsaturated compounds have primarily been benzophenone derivatives, benzoin ethers, benzil monoketals, dibenzosuberone derivatives, anthraquinones, xanthones, thioxanthones and α-halogenoacetophenone derivatives. The industrial applicability of these substances, is, however, markedly restricted by a number of disadvantages. These include, inter alia, the low storage stability in the dark of many photopolymerizable systems to which these initiators have been added, a low chemical stability and an unduly low reactivity in initiating the photopolymerization of ethylenically unsaturated compounds or the hardening of photopolymerizable systems. Many of these known initiators cause yellowing of the polymers prepared with them. This yellowing is extremely undesirable in the coating of materials with a light background and in ultraviolet-hardened printing inks. For this latter field of application, the frequently low solubility of the known initiators in the photopolymerizable system is also a great disadvantage. Printing inks, as a rule, contain considerable quantities of colored pigments which absorb a large part of the energy radiated in. However, this part of the absorbed energy does not become photochemically effective. Thus, a relatively large quantity of initiator must be added in this case. The known initiators then frequently partially crystallize out. Apart from the fact that fractions which have crystallized out can no longer become effective for initiation after some time, the crystallites formed also damage the printing plates which consist of relatively soft materials.

Moreover, German Offenlegungsschrift No. 2,722,264 describes a number of hydroxyalkylphenones as photoinitiators. These display the disadvantages of the hitherto known initiators to a substantially smaller extent. These compounds, some of which are liquid, are markedly more soluble in the customary photopolymerizable systems than are most of the hitherto known initiators, which as a rule are solid. They also have good stability on storage in the dark and good chemical stability. In particular, however, when these initiators are used in photopolymerization, yellowing of the polymers is observed only to a substantially smaller extent than for the hitherto usual initiators. Notwithstanding the increased photoinitiating activity of these hydroalkylphenones as compared with the other known initiators, even these still have an inadequate reactivity in initiating the photopolymerization. As a result, relatively long hardening periods are still required, and this leads to a non-optimum utilization of the ultraviolet irradiation units.

SUMMARY OF THE INVENTION

It is, therefore, an object of this invention to provide photoinitiators, in particular for the photopolymerization of ethylenically unsaturated compounds or for the hardening of photopolymerizable systems, which photoinitiators are physiologically acceptable, have an adequate storage stability in the dark when mixed with the other reactants, do not cause, either themselves or due to their secondary products, any yellowing of the reaction products, have the highest possible solubility in the customary photopolymerizable systems, effect a low surface tackiness of the fully hardened coatings and, at the same time, show the highest possible reactivity in initiating the hardening of photopolymerizable systems and are thus effective even when used in small concentrations.

Upon further study of the specification and appended claims, further objects and advantages of this invention will become apparent to those skilled in the art.

These objects have been attained in one aspect by providing mixtures which can be used as photoinitiators and contain (A) at least one hydroxyalkylphenone of Formula I

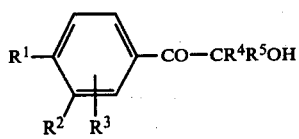

wherein $R^1$ is H, alkyl of 1–4 C atoms or chlorine, $R^2$ is H or methyl, $R^3$ is H or methyl, $R^4$ is alkyl of 1–6 C atoms and $R^5$ is alkyl of 1–6 C atoms, and (B) at least one 2-alkylthioxanthone of formula II

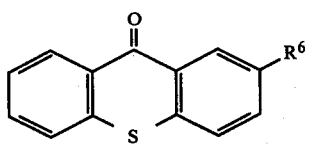

wherein $R^6$ is alkyl of 1–8 C atoms.

This invention also relates in another aspect to the use of these mixtures as photoinitiators, in particular for the photopolymerization of ethylenically unsaturated compounds and for the ultraviolet hardening of printing inks.

Moreover, this invention relates in still another aspect to a photopolymerizable system containing at least one ethylenically unsaturated photopolymerizable compound and, if appropriate, additional known and customary additives, which system comprises as the photoinitiator, a mixture of a hydroxyalkylphenone of Formula I and a 2-alkylthioxanthone of Formula II, and preferably contains 0.1 to 20% by weight of such a mixture.

Furthermore, the present invention also relates in another aspect to a process for photopolymerizing ethylenically unsaturated compounds, which comprises adding a mixture of a hydroxyalkylphenone of Formula I and a 2-alkylthioxanthone of Formula II, preferably 0.1 to 20% by weight of such a mixture, as the photoinitiator to the mixture which is to be polymerized, before initiating the photopolymerization.

DETAILED DISCUSSION

These novel mixtures which can be used as photoinitiators, when compared with the individual components, show a considerably increased reactivity in initiating the photopolymerization of ethylenically unsaturated compounds or the hardening of photopolymerizable systems. Furthermore, the mixtures of this invention have good storage stability in the dark and have the advantage that they can be readily incorporated into the system which is to be polymerized, since these mixtures are liquid, in contrast to the thioxanthone component. The polymers fully hardened using the initiator mixtures of this invention undergo even less yellowing than those polymers which are obtained using only one individual component of these mixtures.

The hydroxyalkylphenones of Formula I, processes for their manufacture and their photoinitiating activity are, as already mentioned, known from German Offenlegungsschrift No. 2,722,264. These compounds, which are predominantly liquid, are readily soluble in the customary photopolymerizable systems, have good storage stability in the dark and good chemical stability.

2-Alkylthioxanthones and their photoinitiating activity have likewise been known for a long time. Thus, for example, U.S. Pat. Nos. 3,169,868 and 3,907,656 describe photopolymerizable systems which, in addition to other compounds, also contain thioxanthones as the photoinitiators. The preparation of such 2-alkylthioxanthones and their suitability as photoinitiators are also described in a review article dealing with the ultraviolet hardening behavior of several photoinitiators and photoactivators, in J. Oil Col. Chem. Assoc, 1978, 61, 256–263. Further preparation processes are described, for example, in German Offenlegungsschrift No. 2,811,755 and in U.S. Pat. No. 4,101,558. The use of 2-alkylthioxanthones as the sole photoinitiator in a photopolymerizable system is, however, restricted by various disadvantages, in particular by the poor solubility of the solid thioxanthones in the particular reaction mixtures and the pronounced tendency toward yellowing of the products fully hardened using thioxanthones.

General data on photoinitiator mixtures which consist of hydroxyalkylphenones and other known photoinitiators, 2-chlorothioxanthone also being mentioned among many other compounds, are already contained in German Offenlegungsschrift No. 2,722,264. It is not possible, however, to derive any indication of the particularly advantageous properties of the specific mixtures of this invention from this publication.

In Formula I, $R^1$ preferably is hydrogen, methyl, i-propyl, tert-butyl or chlorine, and also ethyl, n-propyl, n-butyl or sec-butyl. $R^2$ and $R^3$ are preferably hydrogen. $R^4$ and $R^5$ are preferably identical, but they can also be different. They are unbranched or branched alkyl of 1–6 C atoms, preferably of 1–3 C atoms, in particular methyl.

Accordingly, the following compounds of Formula I are preferred:
1-phenyl-2-hydroxy-2-methyl-propan-1-one,
1-(4'-methylphenyl)-2-hydroxy-2-methyl-propan-1-one,
1-(4'-i-propylphenyl)-2-hydroxy-2-methyl-propan-1-one,
1-(4'-tert-butylphenyl)-2-hydroxy-2-methyl-propan-1-one,
1-(4'-chlorophenyl)-2-hydroxy-2-methyl-propan-1-one,
1-(3',4'-dimethylphenyl)-2-hydroxy-2-methyl-propan-1-one,
1-phenyl-2-hydroxy-2-methyl-butan-1-one,
1-phenyl-2-hydroxy-2-ethyl-butan-1-one, and
1-phenyl-2-hydroxy-2-methyl-pentan-1-one.

In Formula II, $R^6$ is unbranched or branched alkyl of 1–8 C atoms, preferably having 2–6 C atoms, in particular having 3–5 C atoms. Examples of $R^6$ are i-propyl, n-butyl, sec-butyl, n-pentyl, i-pentyl and also methyl, ethyl, n-propyl, tert-butyl, 1-methylbutyl, 2-methylbutyl, 3-methylbutyl, n-hexyl, n-heptyl, n-octyl, 2-ethylhexyl and 3,3-dimethylbutyl.

Accordingly, the following compounds of Formula II are preferred:
2-i-propylthioxanthone,
2-n-butylthioxanthone,
2-n-pentylthioxanthone,
2-n-hexylthioxanthone,
2-sec-butylthioxanthone, and
2-i-pentylthioxanthone.

The preparation of the compounds of Formula I is known from J. Amer. Chem. Soc. 73, 4,702 (1951), J. Gen. Chem. (U.S.S.R.) 30, 792 (1960), Ber. 1967, 1,047, Tetrahedron Letters 1972, 2,423 and German Offenlegungsschrift No. 2,722,264. Preferably, the preparation process disclosed as preferred in German Offenlegungsschrift No. 2,722,264 is used.

The preparation of the compounds of Formula II is described, for example, in Czechoslovak Patent Specification No. 113,698 (abstracted in CA 64, 17,551e), in J. Oil Col. Chem. Assoc. 1978, 61, 256–263, in German Offenlegungsschrift No. 2,811,755 and in U.S. Pat. No. 4,101,558.

The 2-alkylthioxanthones of Formula II can be mixed with the hydroxyalkylphenones of Formula I in proportions of from 0.1 to 99.9% by weight of the total weight of A and B, preferably from 0.1% by weight up to the saturation concentration. Those mixtures are particularly advantageous which contain the two individual components A and B in a weight ratio of from 99.9:0.1 to 40:60. The mixtures thus obtained are liquid. As a result, they have the advantage that they can be readily incorporated into the system which is to be polymerized.

The mixtures of this invention of hydroxyalkylphenones of Formula I and 2-alkylthioxanthones of Formula II can be used as photoinitiators for the photopolymerization of ethylenically unsaturated compounds or for the hardening of photopolymerizable systems which contain such compounds, and particularly also for the ultraviolet hardening of printing inks. Fully conventional procedures are employed when the mixtures are used in this way.

The mixtures of this invention are added, as a rule, in quantities of from 0.1 to 20% by weight, preferably 0.5 to 12% by weight, to the systems which are to be polymerized, based on the total weight of the system. This addition is effected, as a rule, by simply dissolving and stirring them in, since most of the systems to be polymerized and the mixtures of this invention are liquid or at least readily soluble.

The systems which are to be polymerized are understood to include mixtures of monofunctional or polyfunctional ethylenically unsaturated monomers, oligomers, prepolymers, polymers or mixtures of these oligomers, prepolymers and polymers, the polymerization of which can be initiated by free radicals, with unsaturated monomers, which mixtures as a rule can contain other additives, such as, for example, antioxidants, light stabilizers, dyestuffs, pigments and reaction accelerators. Unsaturated compounds which can be used include those in which C=C double bonds are activated by, for example, halogen atoms, carbonyl groups, cyano groups, carboxyl groups, ester groups, amide groups, ether groups or aryl groups or by conjugated additional double bonds or triple bonds. Examples of such compounds include vinyl chloride, vinylidene chloride, acrylonitrile, methacrylonitrile, acrylamide, methacrylamide, or methyl, ethyl, n- or tert-butyl, cyclohexyl, 2-ethylhexyl, benzyl, phenyloxyethyl, hydroxyethyl, hydroxypropyl, lower alkoxyethyl or tetrahydrofurfuryl acrylate or methacrylate, vinyl acetate, vinyl propionate, vinyl acrylate, vinyl succinate, N-vinylpyrrolidone, N-vinyl-carbazole, styrene, divinylbenzene, substituted styrenes and mixtures of such unsaturated compounds. Unsaturated compounds having more than one double bond, such as, for example, ethylene diacrylate, hexane-1,6-diol diacrylate, propoxylated bisphenol A diacrylate and dimethacrylate, trimethylolpropane diacrylate and pentaerythritol triacrylate, can also be polymerized with the photoinitiators of this invention. Other photopolymerizable compounds which can be used are unsaturated oligomers, prepolymers or polymers and mixtures thereof with unsaturated monomers. These include, for example, unsaturated polyesters, unsaturated acrylic materials, epoxy materials, urethanes, silicones, aminopolyamide resins and in particular acrylated resins, such as acrylated silicone oil, acrylated polyester, acrylated urethanes, acrylated polyamides, acrylated soya bean oil, acrylated epoxy resin and acrylated acrylic resin, preferably as mixtures with one or more acrylates of a monoalcohol, dialcohol or polyalcohol.

The photopolymerizable compounds or systems can be stabilized in the known manner by the addition of thermal inhibitors or antioxidants, such as, for example, hydroquinone or hydroquinone derivatives, pyrogallol, thiophenols, nitro compounds, $\beta$-naphthylamines or $\beta$-naphthols in the customary quantities, without the initiator activity of the mixtures of this invention being significantly impaired. Such additions are intended, above all, to prevent a premature polymerization during the preparation of the systems by mixing of the components.

Furthermore, small amounts of light stabilizers, such as, for example, benzophenone derivatives, benzotriazole derivatives or phenyl salicylates, can be added.

To exclude the inhibiting action of atmospheric oxygen, paraffins or similar waxy substances are also frequently added to the photopolymerizable systems. Due to the lack of solubility in the polymer, these float at the start of the polymerization and form a transparent surface layer which prevents the access of air. The atmospheric oxygen can also be deactivated, for example, by the introduction of autoxidizable groups, such as, for example, allyl groups, into the system which is to be hardened.

Moreover, known pigments or dyestuffs which are customary, for example, in printing inks which fully harden photochemically, can be added to the photopolymerizable systems. In this case, the selected quantity of photoinitiator is generally higher, for example 6 to 12% by weight, while 0.1 to 3% by weight is in most cases fully adequate for colorless photopolymerizable products. Depending on the intended use, additional fillers, such as talc, plaster or silica, fibers, organic additives, such as thixotropic agents, levelling agents, additional binders, lubricants, dulling agents, plasticizers, wetting agents, silicones for improving the nature of the surface, anti-floating agents or small amounts of solvents can be added.

It is particularly advantageous to add reaction accelerators to the mixtures which can be used as photoinitiators or to the photopolymerizable systems. Examples of such reaction accelerators include organic amines, phosphines, alcohols and/or thiols, all of which have at least one CH group in the $\alpha$-position relative to the hetero-atom. Very particularly suitable are, for example, primary, secondary and tertiary aliphatic, aromatic, araliphatic or heterocyclic amines, such as described, for example, in U.S. Pat. No. 3,759,807. Examples of such amines are butylamine, dibutylamine, tributylamine, cyclohexylamine, benzyldimethylamine, dicyclohexylamine, triethanolamine, N-methyldiethanolamine, phenyl-diethanolamine, piperidine, piperazine, morpholine, pyridine, quinoline, ethyl p-dimethylaminobenzoate, butyl p-dimethylaminobenzoate, 4,4'-bis-dimethylamino-benzophenone (Michler's ketone) or 4,4'-bis-diethylamino-benzophenone. Tertiary amines, such as, for example, trimethylamine, triethylamine, tri-isopropylamine, tributylamine, octyl-dimethylamine, dodecyl-dimethylamine, triethanolamine, N-methyl-diethanolamine, N-butyl-diethanolamine, tris-(hydroxypropyl)-amine, alkyl dimethylaminobenzoate and Michler's ketone are particularly preferred.

Further reaction accelerators which can be used include, for example, trialkylphosphines, secondary alcohols and thiols.

Mixtures which can be used as photoinitiators or photopolymerizable systems both additionally containing at least one organic amine as a reaction accelerator, thus represent a particularly preferred form of the present invention.

As a rule, these reaction accelerators are added to the mixtures of this invention or the photopolymerizable systems in such amounts that the weight ratio of reaction accelerator to individual component B of the mixture of this invention is from 1:0.01 to 1:10. Particularly preferred is a weight ratio of reaction accelerator to component B of from 1:0.05 to 1:1.

The expression "photopolymerization of ethylenically unsaturated compounds" is referred to in the widest sense. These include, for example, the additional polymerization or the cross-linking of polymeric materials, for example those of prepolymers, the homopolymerization, copolymerization and terpolymerization of simple monomers and also the combination of such types of reaction.

The photopolymerization can be carried out in accordance with known methods by irradiation with visible light or ultraviolet radiation of the wavelength range from 250 to 500 nm, preferably from 300 to 400 nm. Suitable radiation sources include sunlight or artificial radiators. For example, high-pressure, medium-pressure or low-pressure mercury lamps, xenon lamps and tungsten lamps are advantageous; laser light sources can also be employed.

The mixtures of this invention can be used as photo-initiators in the ultraviolet hardening of thin layers, such as, for example, paper coatings, plastic coatings and metal coatings, and they have particular advantages as initiators for the photo-hardening of printing inks and for photo-hardenable systems for the preparation of printing plates.

In particular, the photo-hardening of printing inks has gained great importance, since the drying time of the binder is a decisive factor in the production rate of graphical products and is of the order of fractions of seconds. In the preparation of printing plates, for example, mixtures of soluble linear polyamides with photopolymerizable monomers, for example acrylamides, and a photoinitiator are used. Films or plates comprising these systems are exposed above the negative or above the positive of the original to be printed and the unhardened fractions are subsequently eluted with a solvent.

Without further elaboration, it is believed that one skilled in the art can, using the preceding description, utilize the present invention to its fullest extent. The following preferred specific embodiments are, therefore, to be construed as merely illustrative and not limitative of the remainder of the disclosure in any way whatsoever.

In the examples which follow, the preparation and use of the mixtures of this invention as photoinitiators in the photopolymerization of ethylenically unsaturated compounds are described in more detail.

EXAMPLE A

A resin mixture, consisting of 100 parts of titanium dioxide (anatase), 63.5 parts of a urethane acrylate resin (Uvimer ®530 from Messrs. Bayer, Leverkusen), 36.5 parts of butane-1,4-diol diacrylate and 4 parts of N-methyldiethanolamine is applied, after the addition of 2.5% of the initiator mixture, to aluminum foil in a thickness of 15 μm under yellow light in order to exclude uncontrollable influences due to daylight. The subsequent hardening of these films is carried out by means of a Minicure apparatus (from Messrs. Primarc ITP (England) in which the lacquer samples on a transport belt are moved past at variable speed under a Hg high-pressure lamp (radiation intensity 80 W/cm) and are thus irradiated. The radiation dose is varied by changing the belt speed.

In Tables 1 to 4 which follow, the composition of the initiator mixture used is indicated in each case in parts by weight in the first columns. In the last column, the belt speed (in m/minute) is indicated, at which the film is hardened just to such an extent that damage to the layer by means of a pencil of hardness 6B is no longer possible. The more reactive the initiator mixture, the shorter the irradiation time required to obtain the same degree of hardening of a lacquer system hardened by means of ultraviolet radiation, under otherwise identical conditions.

TABLE 1

| Composition of the Initiator Mixture | | |
|---|---|---|
| Parts of 1-phenyl-2-hydroxy-2-methyl-propan-1-one | Parts of 2-i-propyl-thio-xanthone | Belt speed in m/minute |
| 100 | — | 20 |
| 99 | 1 | 40 |
| 95 | 5 | >250 |
| 90 | 10 | >250 |
| 80 | 20 | >250 |
| 60 | 40 | >250 |
| — | 100 | 15 |

EXAMPLE B 2.5% by weight of the particular initiator mixture are added to a resin mixture, consisting of 100 parts of titanium dioxide (anatase), 63.5 parts of an epoxy-acrylate resin (Laromer ®2555 from Messrs. BASF, Ludwigshafen), 36.5 parts of butane-1,4-diol diacrylate and 4 parts of N-methyldiethanolamine. The mixture is applied to an aluminum foil and irradiated, as described in Example A. In this case, the following results were obtained:

TABLE 2

| Composition of the Initiator Mixture | | | | |
|---|---|---|---|---|
| Parts of 1-phenyl-2-hydroxy-2-methyl-propan-1-one | Parts of 1-(4'-chloro-phenyl)-2-hydroxy-2-methyl-propan-1-one | Parts of 2-methyl-thio-xanthone | Parts of 2-i-pro-pylthio-xanthone | Belt speed in m/minute |
| 100 | — | — | — | 4 |
| 99 | — | 1 | — | 20 |
| 95 | — | 5 | — | 45 |
| 85 | — | 15 | — | 55 |
| — | — | 100 | — | 20 |
| — | 100 | — | — | 2 |
| — | 99 | — | 1 | 20 |
| — | 90 | — | 10 | 40 |
| — | 60 | — | 40 | 35 |
| — | — | — | 100 | 10 |
| — | 99 | 1 | — | 20 |
| — | 85 | 15 | — | 50 |

EXAMPLE C 2.5% by weight of the particular initiator mixture is added to a resin mixture consisting of 100 parts of titanium dioxide (anatase), 63.5 parts of SVP ®1928 (resin from Messrs. Degussa, Frankfurt/Main), 36.5 parts of butane-1,4-diol diacrylate and 4 parts of N-methyldiethanolamine. The mixture is applied to aluminum foil and irradiated, as described in Example A.

The results obtained with various photoinitiator mixtures are shown in Table 3 which follows.

TABLE 3

| Composition of the Initiator Mixture | | | |
|---|---|---|---|
| Parts of 1-(4'-i-propyl-phenyl)-2-hydroxy-2-methyl-propan-1-one | Parts of 2-i-propyl-thioxanthone | Parts of 2-methyl-thio-xanthone | Belt Speed in m/minute |
| 100 | — | — | 4 |
| 99 | 1 | — | 15 |
| 90 | 10 | — | 40 |
| 80 | 20 | — | 40 |
| 60 | 40 | — | 35 |
| — | 100 | — | 15 |
| 99 | — | 1 | 15 |
| 95 | — | 5 | 40 |
| 85 | — | 15 | 45 |
| — | — | 100 | 20 |

EXAMPLE D 2.5% by weight of the initiator mixture is added to a resin mixture consisting of 45 parts of an acrylate resin (Plex ®6628-0 from Messrs. Röhm, Darmstadt), 18.5 parts of a further acrylate resin (Plex ®6673-0 from Messrs. Röhm, Darmstadt), 36.5 parts of butane-1,4-diol diacrylate and 4 parts of N-methyldiethanolamine. The mixture is applied to aluminum foil and irradiated as described in Example A.

The results are assembled in Table 4:

TABLE 4

| Composition of the Initiator Mixture | | | |
|---|---|---|---|
| Parts of 1-(3',4'-dimethyl-phenyl)-2-hydroxy-2-methyl-propan-1-one | Parts of 2-i-propyl-thioxanthone | Parts of 2-methyl-thio-xanthone | Belt Speed in m/minute |
| 100 | — | — | 10 |
| 99 | 1 | — | 25 |
| 90 | 10 | — | >250 |
| 80 | 20 | — | >250 |
| 60 | 40 | — | >250 |
| — | 100 | — | 15 |
| 99 | — | 1 | 25 |
| 95 | — | 5 | >250 |
| 85 | — | 15 | >250 |
| — | — | 100 | 20 |

EXAMPLE E 2.5% by weight of a mixture of 99.9 parts of 1-phenyl-2-hydroxy-2-methyl-propan-1-one and 0.1 part of 2-i-propyl-thioxanthone is added to a resin mixture consisting of 100 parts of titanium dioxide (anatase), 63.5 parts of an epoxy-acrylate resin (Laromer ®2555 from Messrs. BASF, Ludwigshafen), 36.5 parts of butane-1,4-diol diacrylate and 4 parts of N-methyldiethanolamine. The resulting mixture is applied to aluminum foil. After irradiation, a white, tack-free, fully hardened surface-coating is obtained.

EXAMPLE F 2.5% by weight of a mixture of 40 parts of 1-(4-i-propylphenyl)-2-hydroxy-2-methylpropane-1-one and 60 parts of i-pentylthioxanthone is added to a resin mixture consisting of 100 parts of titanium dioxide (anatase), 63.5 parts of an acrylate resin (Plex ®6628-0 from Messrs. Röhm, Darmstadt), 18.5 parts of a further acrylate resin (Plex ®6673-0 from Messrs. Röhm, Darmstadt), 36.5 parts of butane-1,4-diol diacrylate and 4 parts of N-methyldiethanolamine. The resultant mixture is applied to aluminum foil. The film obtained after irradiation is tack-free and scratch-resistant.

EXAMPLE G 63.5 parts of an epoxy-acrylate resin (Laromer ®8555 from Messrs. BASF, Ludwigshafen), together with 36.5 parts of butanediol diacrylate and 20 parts of Heliogenblau, are ground on a three-roll mill. 2% by weight of a mixture of 90 parts of 1-(4-chlorophenyl)-2-hydroxy-2-methyl-propan-1-one and 10 parts of 2-isopropylthioxanthone is added to the blue printing ink obtained. After printing on art paper in a thickness of 1 μm, the paper is irradiated with ultraviolet light. The printed sheets obtained can be stacked immediately.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A composition comprising
   (A) 0.1 to 99.9 weight % of at least one hydroxyalkylphenone of the formula

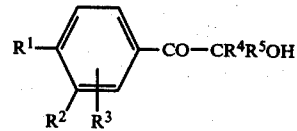

wherein $R^1$ is H, alkyl of 1–4 C atoms or chlorine, $R^2$ is H or methyl, $R^3$ is H or methyl, $R^4$ is alkyl of 1–6 C atoms and $R^5$ is alkyl of 1–6 C atoms, and
   (B) 99.9 to 0.1 weight % of at least one 2-alkylthioxanthone of the formula

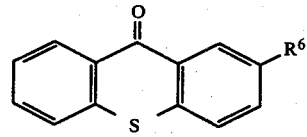

wherein $R^6$ is alkyl of 1–8 C atoms.

2. A composition consisting essentially of (A) and (B) as defined in claim 1.

3. A composition of claim 1 wherein the weight ratio of (A) to (B) is 99.9:0.1 to 40:60.

4. A composition of claim 1 additionally comprising at least one organic amine which has at least one CH group in the α-position relative to the nitrogen-atom, the weight ratio of amine to component B being 1:0.01 to 1:10.

5. A composition of claim 1 wherein $R^1$ is H, methyl, i-propyl, tert-butyl, or Cl; $R^2$ and $R^3$ are H; $R^4$ and $R^5$ are identical and are $C_{1-3}$-alkyl; and $R^6$ is $C_{3-5}$-alkyl.

* * * * *